(12) United States Patent
Yaguchi et al.

(10) Patent No.: US 9,964,560 B2
(45) Date of Patent: May 8, 2018

(54) TRANSFER MOLD TYPE SENSOR DEVICE

(71) Applicant: Hitachi Automotive Systems, Ltd., Hitachinaka-shi, Ibaraki (JP)

(72) Inventors: Akihiro Yaguchi, Hitachinaka (JP); Masahide Hayashi, Hitachinaka (JP); Kazunori Ohta, Hitachinaka (JP); Akihiro Okamoto, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 181 days.

(21) Appl. No.: 14/901,358

(22) PCT Filed: Feb. 5, 2014

(86) PCT No.: PCT/JP2014/052610
§ 371 (c)(1),
(2) Date: Dec. 28, 2015

(87) PCT Pub. No.: WO2014/208116
PCT Pub. Date: Dec. 31, 2014

(65) Prior Publication Data
US 2016/0131678 A1    May 12, 2016

(30) Foreign Application Priority Data
Jun. 28, 2013 (JP) ................... 2013-135738

(51) Int. Cl.
*G01P 3/04* (2006.01)
*G01P 15/02* (2013.01)
(Continued)

(52) U.S. Cl.
CPC .............. *G01P 15/02* (2013.01); *G01C 19/04* (2013.01); *G01C 19/5783* (2013.01);
(Continued)

(58) Field of Classification Search
USPC .......................................................... 73/511
See application file for complete search history.

(56) References Cited

U.S. PATENT DOCUMENTS 6,148,673 A * 11/2000 Brown ................ G01L 19/0038
257/676
8,466,540 B2    6/2013 Tanaka et al.
(Continued)

FOREIGN PATENT DOCUMENTS

| JP | 3964850 B2 | 8/2007 |
|---|---|---|
| JP | 2010-177510 A | 8/2010 |
| WO | WO 2005/019790 A1 | 3/2005 |

OTHER PUBLICATIONS

International Search Report (PCT/ISA/210) issued in PCT Application No. PCT/JP2014/052610 dated Apr. 8, 2014 with English translation (Two (2) pages).

*Primary Examiner* — Clayton E Laballe
*Assistant Examiner* — Warren K Fenwick
(74) *Attorney, Agent, or Firm* — Crowell & Moring LLP

(57) ABSTRACT

To provide a high-reliable transfer mold type sensor device in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed, the combined sensor is configured to be thicker than the substrate and the chip pad, a principal surface side of the combined sensor is covered with the mold resin and a back surface side thereof contacts the substrate by a joint material, and the combined sensor is arranged on a package neutral surface in a cross-section of a thickness direction of the package including the combined sensor, the substrate, and the chip pad.

11 Claims, 10 Drawing Sheets

(51) Int. Cl.

| | |
|---|---|
| *G01C 19/5783* | (2012.01) |
| *G01P 1/02* | (2006.01) |
| *G01P 15/08* | (2006.01) |
| *G01C 19/04* | (2006.01) |
| *H01L 23/495* | (2006.01) |
| *H01L 23/00* | (2006.01) |
| *H01L 23/31* | (2006.01) |

(52) U.S. Cl.
CPC .......... *G01P 1/023* (2013.01); *G01P 15/0802* (2013.01); *H01L 23/49531* (2013.01); *H01L 23/49541* (2013.01); *H01L 23/562* (2013.01); *H01L 23/3107* (2013.01); *H01L 23/49551* (2013.01); *H01L 24/73* (2013.01); *H01L 2224/32145* (2013.01); *H01L 2224/32245* (2013.01); *H01L 2224/45144* (2013.01); *H01L 2224/48145* (2013.01); *H01L 2224/48247* (2013.01); *H01L 2224/73265* (2013.01); *H01L 2924/181* (2013.01)

(56) References Cited

U.S. PATENT DOCUMENTS

| | | |
|---|---|---|
| 2006/0053908 A1 | 3/2006 | Ishigami et al. |
| 2009/0282917 A1 | 11/2009 | Acar |
| 2010/0218607 A1* | 9/2010 | Kazama ................ G01P 15/123 73/514.33 |

* cited by examiner

DISTANCE TO NEUTRAL LINE (AXIS) $\lambda$ $\lambda = \Sigma E_i \cdot t_i \cdot y_i / \Sigma E_i \cdot t_i$ $E_i$: YOUNG'S MODULUS OF i-TH MEMBER
$t_i$: THICKNESS OF i-TH MEMBER
$y_i$: DISTANCE FROM BOTTOM SURFACE TO NEUTRAL AXIS OF i-TH MEMBER

TRANSFER MOLD TYPE SENSOR DEVICE

TECHNICAL FIELD

The present invention relates to a transfer mold type sensor device in which a combined sensor including a plurality of acceleration sensor and an angular velocity sensor is sealed with a resin by a transfer mold and a package is formed.

BACKGROUND ART

Recently, a sensor device to detect various physical amounts has been developed to realize a stable operation and improved reliability of a vehicle, a mobile phone, and a digital camera. In the vehicle, particularly, an acceleration sensor and an angular velocity sensor are applied widely for apparatus (for example, an airbag) control to prevent sideslip and improve a safety of passengers. When the sensor device is applied to the vehicle, the sensor device may be mounted in an engine room. For this reason, the sensor device needs to endure a severe environment load such as a thermal change and a mechanical vibration and the sensor device needs to be miniaturized so that the device can be mounted in a limited space.

In the acceleration sensor and the angular velocity sensor mounted on the sensor device, a detection mechanism using fine processing technology of silicon (Si) is mainly used for the purpose of miniaturization, multi-functionality/complexity, and improvement of mass productivity. A minute comb-shaped structure of silicon is formed by the fine processing technology, minute displacement of the comb-shaped structure is converted into an electric signal, and physical amounts such as acceleration and angular velocity are detected.

In the sensor device in which the acceleration sensor and the angular velocity sensor are sealed with a resin and a package is formed, linear expansion coefficients of embedded members such as the sensors and a substrate configuring the package and the sealing resin are different from each other. In addition, sizes and thickness of the members such as the sensors and the substrate embedded in the package are generally different from each other and the members are often arranged with asymmetric structures in the package. If a temperature change is applied to the package, warpage deformation may occur in the package due to the difference of the linear expansion coefficients between the members and asymmetry of the structures. Due to the warpage deformation of the package, deformation (expansion/contraction and warpage) occurs in the sensor and the sensor is inclined according to the warpage of the package. If the sensor deforms or is inclined, a position changes, and then stress occurs in the sensor. As a result, the comb-shaped structure in the sensor also deforms and a detection signal is output even in a state in which inertial force such as the acceleration and the angular velocity does not act addition a detection range of the inertial force is narrowed and reliability of the sensor device is greatly decreased. Therefore, in the sensor device in which the fine processing technology of the silicon is applied to a detection mechanism of the inertial force such as the acceleration and the angular velocity, it is necessary to realize a package structure that does not cause the position change such as the deformation, and the inclination in the packaged sensor.

An example of a sensor device in which an acceleration sensor and a pressure sensor are sealed with a resin and a package (mold body) is formed is disclosed in PTL 1. In the sensor device disclosed in PTL 1, the acceleration sensor, the pressure sensor, and a signal processing circuit are arranged on a lead to form a line in a transverse direction (plane direction) of the package and the acceleration sensor and the pressure sensor are arranged at almost symmetrical positions with respect to a center of the signal processing circuit. In technology disclosed in PTL 1, to reduce thermal stress occurring in a physical amount sensor due to a difference of linear expansion coefficients of the physical amount sensor and the mold body made of a plastic material, the following configuration is adopted. That is, a mold body thickness between the physical amount sensor and a surface of the sensor-side mold body and a mold body thickness between the lead and a surface of the lead-side mold body are almost equalized. Or, a volume of a portion covering a top surface side of the lead of the mold body and a volume of a portion covering a bottom surface side of the lead of the mold body are almost equalized.

In addition, an example of a semiconductor device to decrease stress received by a semiconductor chip sealed with a resin is disclosed in PTL 2. In the semiconductor device having a tape carrier package structure disclosed in PTL 2, both a principal surface and a back surface of the semiconductor chip thinner than a tape carrier are sealed with the sealing resin. The sealed semiconductor chip is arranged at a position of a thickness direction of the tape carrier, such that a package stress neutral surface parallel to the principal surface of the semiconductor chip and a stress neutral surface of the semiconductor chip are almost matched with each other. By such an arrangement of the semiconductor chip, the stress received by the semiconductor chip can be decreased, even though the entire package deforms.

CITATION LIST

Patent Literatures

PTL 1: WO 2005/019790
PTL 2: Publication of U.S. Pat. No. 3,964,850

SUMMARY OF INVENTION

Technical Problem

In the sensor device disclosed in PTL 1, to reduce the thermal stress occurring in the physical amount sensor, the mold body thickness between the physical amount sensor and the surface of the sensor-side mold body and the mold body thickness between the lead and the surface of the lead-side mold body are almost equalized for a sensor mounting portion. In addition, the volume of the portion covering the top surface side of the lead of the mold body and the volume of the portion covering the lower side of the lead of the mold body are almost equalized. In this configuration, a thermal deformation amount of a plastic material in at least the sensor mounting portion is almost equalized. However, in a portion of the signal processing circuit arranged in a center portion of the package, the thickness of the lead body of each of the signal processing circuit side and the lead side is different. Due to a thermal deformation difference of the plastic materials of the upper and lower portions in the portion of the signal processing circuit, warpage deformation (out-of-plane deformation of a package thickness direction) of the entire package occurs. The sensor device described in PTL 1 has a configuration in which the plurality of sensors and the signal processing circuit are arranged linearly in a transverse direction of the package. For this arrangement, the mold body thickness is different in a mounting portion of the members such as the sensors and a non-mounting portion in the transverse direction of the package and a region where the mold body thickness is different is wide, which results in causing the warpage deformation of the entire package.

The warpage deformation of the entire package also affects the physical amount sensor arranged around the signal processing circuit and the warpage deformation occurs in the sensor or the sensor is inclined by the warpage of the package. An inertial force detection structure in the sensor is deformed by the warpage or the inclination of the sensor and a variation or a change of a reference point occurs in detection of the physical amount.

In addition, because the sensor device has the configuration in which the plurality of sensors and the signal processing circuit are arranged linearly in the transverse direction of the package, the size of the transverse direction of the package increases and it is difficult to miniaturize the sensor device.

In the semiconductor device described in PTL 2, because the semiconductor chip is extraordinarily thin (the thickness is about 50 µm), resin sealing is enabled without using a member (for example, a lead frame) to hold the semiconductor chip in a mold and both the principal surface and the back surface of the semiconductor chip can be covered with the sealing resin. Because the principal surface and the back surface of the semiconductor chip are made of the same material, the stress neutral surface of the semiconductor chip and the stress neutral surface of the package can be easily matched with each other. However, even when the stress neutral surface of the semiconductor chip and the stress neutral surface of the package slightly deviate from each other, the stress by the warpage of the package acts on the semiconductor chip.

In the sensor for the physical amount detection targeted by the present application, the plurality of comb-shaped structures are provided as the detection mechanism of the inertial force by the fine processing of the silicon and it is necessary to prepare a space to displace the comb. In addition, it is necessary to secure the thickness of the silicon member to some degree to prevent a volume of the space from being changed by the resin mold (mold pressure or contraction stress of the mold resin). Due to this structure, it is difficult to decrease the thickness of the sensor targeted by the present application, like the semiconductor chip (50 µm) described in PTL 2, and the thickness becomes about 0.5 mm (500 µm) to 1.0 mm. In addition, the semiconductor chip to control the sensor and execute detection signal processing also needs to be arranged in the vicinity of the sensor to decrease a signal processing time and the size of the package and it is necessary to provide the member (for example, the lead frame) to hold the sensor and the semiconductor chip in the mold to seal the sensor and the semiconductor chip with the resin by a transfer mold system.

To seal the physical amount detection sensor, the semiconductor chip, and the holding member (lead frame) with the resin, form the package, and miniaturize the package, and the packaging members are preferably laminated and arranged sequentially. A metal wire to perform electric connection with the semiconductor chip is joined to the principal surface of the sensor and the sensor is covered with the sealing resin. The sensor is mounted on the principal surface of the semiconductor chip and the back surface of the sensor adheres to the principal surface of the semiconductor chip by a connection member. The semiconductor chip is mounted on the holding member and the back surface of the semiconductor chip adheres to the holding member by the connection member.

In the package in which the sensor provided with the minute comb-shaped structure to be the inertial force detection mechanism is sealed with the resin, it is necessary to decrease the stress occurring in the sensor. However, when a plurality of different members are laminated in the package thickness direction, it is difficult to realize both almost matching the stress neutral surface of the sensor and the stress neutral surface of the package and miniaturizing (size decrease) the package, like PTL 2.

An object of the invention is to provide a high-reliable transfer mold type sensor device that suppresses deformation of a combined sensor having a function of measuring predetermined physical amounts such as acceleration and angular velocity inside, reduces stress caused by the deformation, and achieves miniaturization.

Solution to Problem

To resolve the above problem, the following configuration is adopted in the invention.

In a transfer mold type sensor device in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed, the combined sensor is configured to be thicker than the substrate and the chip pad, a principal surface side of the combined sensor is covered with the mold resin and a back surface side thereof contacts the substrate by a joint material, and the combined sensor is arranged on a package neutral surface in a cross-section of a thickness direction of the package including the combined sensor, the substrate, and the chip pad.

Advantageous Effects of Invention

According to the invention, a high-reliable transfer mold type sensor device that suppresses deformation of a combined sensor having a function of measuring predetermined physical amounts such as acceleration and angular velocity inside, reduces stress caused by the deformation, and achieves miniaturization can be provided.

DESCRIPTION OF EMBODIMENTS

First Embodiment

Hereinafter, a transfer mold type sensor device according to a first embodiment will be described using the drawings.

Figure 1:
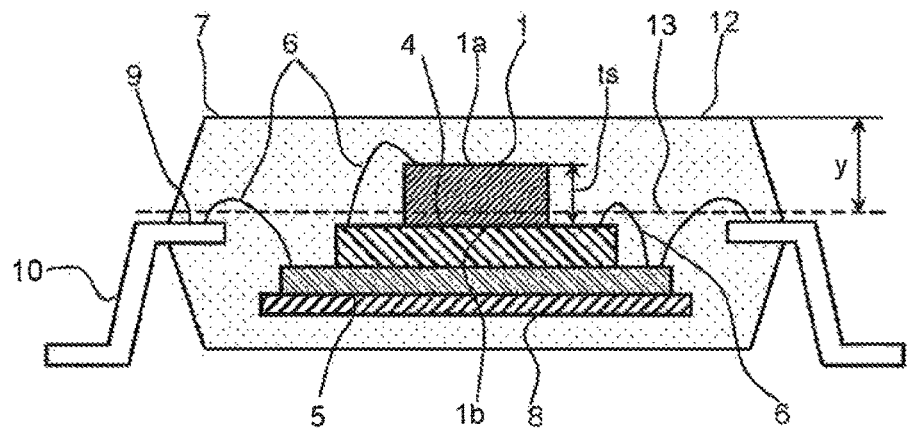
FIG. 1 is a cross-sectional view illustrating a first embodiment of a transfer mold type sensor device according to the present invention.
Figure 2:
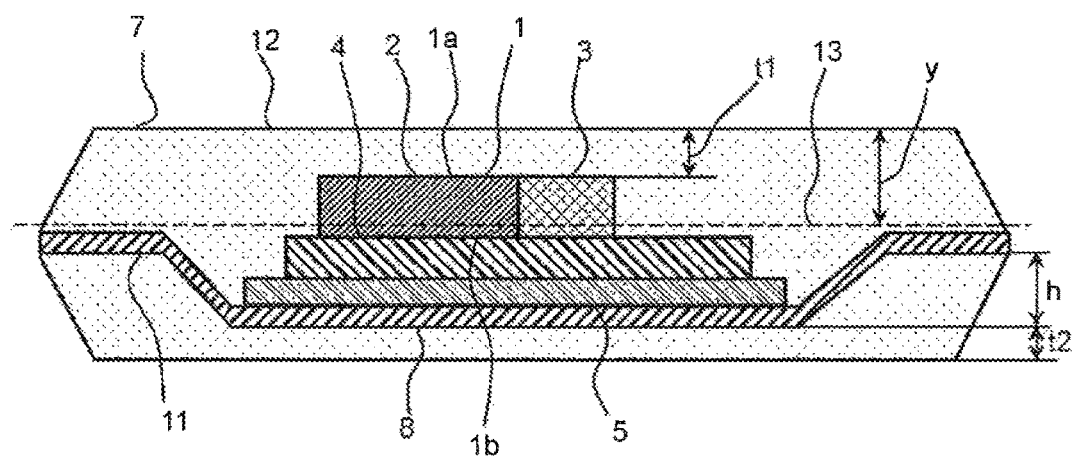
FIG. 2 is a cross-sectional view of a different direction of the transfer mold type sensor device illustrated in FIG. 1.
Figure 3:
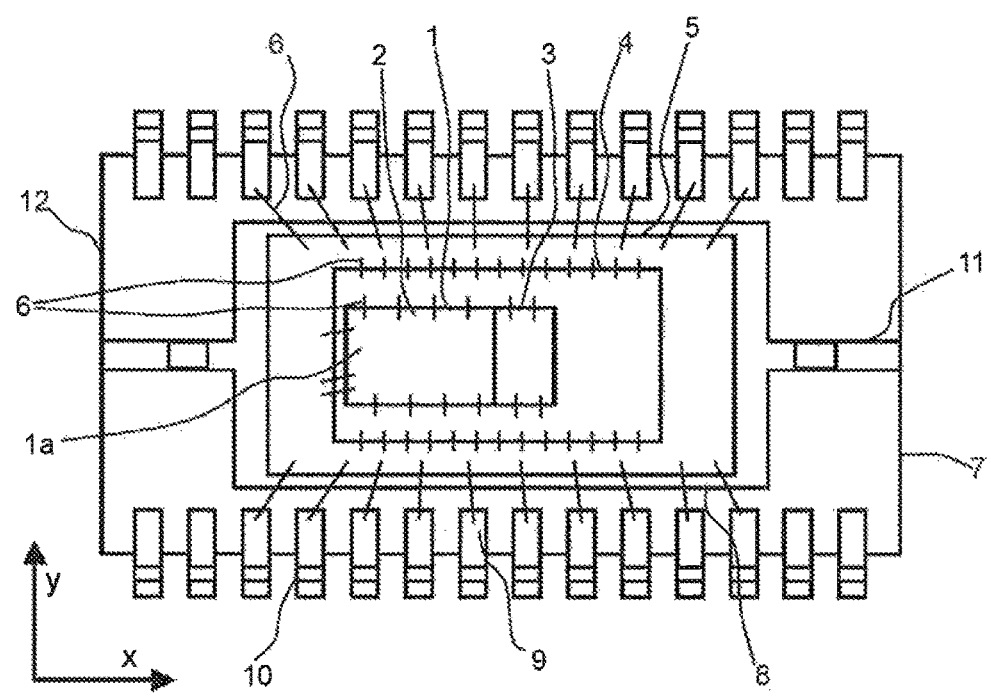
FIG. 3 is a plan view of the case in which an upper mold resin is removed from an inner lead of the transfer mold type sensor device illustrated in FIGS. 1 and 2.

FIGS. 1 and 2 are cross-sectional views of a transfer mold type sensor device according to the present invention and FIG. 3 is a plan view of the case in which an upper mold resin is removed from an inner lead 9.

As illustrated in FIGS. 1 and 2, in the transfer mold type sensor device, an interposer 5, a semiconductor chip 4, and a combined sensor 1 are sequentially laminated on a chip pad 8. The combined sensor 1 includes an angular velocity sensor unit 2 and an acceleration sensor unit 3 and is arranged in a plane direction, as illustrated in FIG. 2. The combined sensor 1 and the semiconductor chip 4 are electrically connected by a wire 6 to join an electrode (not illustrated in the drawings) on a principal, surface 1a of the combined sensor 1 and an electrode (not illustrated in the drawings) on the semiconductor chip 4. Likewise, the combined sensor 1 and the semiconductor chip 4 and the interposer 5 are electrically connected by the wire 6 and the interposer 5 and the inner lead are electrically connected by the wire 6. An electrode (not illustrated in the drawings) to join the wire 6 is also provided on a surface of the interposer 5. A mold resin 12 seals the combined sensor 1, the semiconductor chip 4, the interposer 5, the chip pad 8, the inner lead 9, and the wire 6 to form a package 7. An outer lead 10 connected to the inner lead 9 protrudes from the mold resin 12 on a lateral surface of the package 7 and is connected to a mounting substrate or a casing outside the package 7.

The chip pad 8 is held by a supported lead 11, as illustrated in FIG. 2. The chip pad 8 bends the supported lead 11 in a thickness direction of the package 7 and is arranged below the supported lead 11 and the inner lead 9.

The combined sensor 1, the semiconductor chip 4, and the interposer 5 are mounted on predetermined portions of the semiconductor chip 4, the interposer 5, and the chip pad 8, respectively, by a joint material not illustrated in the drawings. As the joint material, a paste-like joint material or a film-like joint material is used. Because the film-like joint material maintains a thickness after joining members uniformly, the film-like joint material suppresses a variation (variation of levelness) of a mounting position of the member and reduces a variation of a sensor output.

In this embodiment, the thickness ts of the combined sensor 1 is set to be larger than a thickness of the semiconductor chip 4 and the chip pad 8 and bending rigidity is increased. In addition, the combined sensor 1 is arranged on a neutral surface 13 (surface in which stress becomes zero at a position of a distance y from a top surface of the package 7 illustrated in FIGS. 1 and 2) of a package thickness direction of a mounting portion of the combined sensor 1 in a cross-section of the package 7. In addition, the combined sensor 1 and the semiconductor chip 4 are laminated in the package 7, such that volumes of the mold resin 12 on and below the neutral surface 13 are almost equalized. The combined sensor 1, the semiconductor chip 4, and the chip pad 8 are arranged such that the volumes of the mold resin on and below the neutral surface 13 are almost equalized. For this reason, the supported lead 11 is bent to the lower side of the package 7 (bending amount h), as described above.

In this embodiment, the acceleration sensor unit 3 of the combined sensor 1 is arranged in a region where a change rate is small when the package 7 is deformed by the warpage, as illustrated in FIGS. 2 and 3. Because the acceleration sensor also detects gravity acceleration, the acceleration sensor detects acceleration even though the acceleration sensor is inclined from a horizontal state by the warpage deformation of the package 7 due to a temperature change, which results in causing an error. If the acceleration sensor unit 3 is arranged on a portion of the package 7 with a small warpage change rate, the acceleration sensor unit 3 can maintain the horizontal state even though the warpage occurs in the package 7 and can prevent a detection error from occurring. When sensors of two axes of an X direction (longitudinal direction of the package 7) and a Y direction (transverse direction of the package 7) illustrated in FIG. 3 are mounted in the acceleration sensor unit 3, a sensor having a detection axis in the X direction is preferably arranged in a region of the package 7 where a warpage change rate is small. This is because a warpage amount of the X direction is larger than a warpage amount of the Y direction in the rectangular package illustrated in FIG. 3.

In the sensor device according to this embodiment, the combined sensor 1 thicker than the other members is arranged on the neutral surface 13 in the cross-section of the package including the combined sensor 1. In addition, the volumes of the mold resin 12 on and below the neutral surface 13 are almost equalized. As a result, the warpage deformation occurring in the package 7 by expansion/contraction of the mold resin 12 when a thermal change is applied to the package 7 is reduced. In addition, because the combined sensor 1 is arranged on the neutral surface and rigidity of the combined sensor 1 increases, the stress occurring in the combined sensor 1 can be further reduced. In addition, the acceleration sensor unit 3 sensitive to the deformation behavior of the package 7 is arranged in the region where the change rate of the package warpage deformation is small, so that an output change can be suppressed. By this configuration, even when the package 7 deforms, a comb-shaped structure (not illustrated in the drawings) in the combined sensor 1 can be suppressed from deforming, detection stability of physical amounts to be detected can be improved, and a sensor device with a small detection error can be provided.

In addition, in this embodiment, because the members of the combined sensor 1, the semiconductor chip 4, and the chip pad 8 are laminated in the thickness direction of the package 7, a package size can be prevented from increasing in the transverse direction and miniaturization of the package 7 can be realized.

The combined sensor 1 is formed by providing a comb-shaped physical amount detection unit formed by executing fine processing on silicon (Si) and sealing a surrounding portion thereof with Si and glass in a lamination state. In the semiconductor chip 4, a predetermined circuit and an electrode are formed on Si using semiconductor processing technology. The semiconductor chip 4 controls a detection operation of the combined sensor 1 and executes input/output control of a sensor detection signal with respect to the package. The interposer 5 is composed of a glass epoxy substrate (for example, FR4 or FR5) and a predetermined conductor pattern and an electrode are formed on a surface of the interposer or in the interposer. The chip pad 8, the inner lead 9, the outer lead 10, and the supported lead 11 are assembled for packaging in a state in which these are connected to the lead frame and are cut from the lead frame after packaging by the mold resin 12. The lead frame is made of a metal material such as a copper alloy (Cu) and an iron-nickel alloy (Fe-42Ni). The outer lead 10 is formed in a predetermined shape to connect a lead tip to an external mounting substrate. As the wire 6, an Au (gold) wire having a diameter of 25 μm is used. As the mold resin 12, a thermosetting epoxy resin filled with silica particles is used. In addition, a linear expansion coefficient $\alpha 1$ (linear expansion coefficient at a temperature equal to or lower than a glass transition temperature) of the mold resin 12 is set preferably in a range of 7 to $11 \times 10^{-6}/°$ C. By setting the linear expansion coefficient of the mold resin 12 in the range, even though the lead frame is made of any one of a Cu material and an iron material (Fe-42Ni), liner expansion coefficients of the mold resin and the read frame are matched with each other, detachment of a mold resin joint interface is suppressed, and the stress occurring in the combined sensor 1 can be suppressed from being increased due to the detachment.

The reason why the linear expansion coefficient $\alpha 1$ of the mold resin 12 is preferably set in the range of 7 to $11 \times 10^{-6}/°$ C. will be described in detail below. The combined sensor 1 is mainly made of silicon (Si) and a linear expansion coefficient thereof is about $3 \times 10$-6/° C. If transfer mold sealing is performed on the combined sensor 1 using the mold resin 12, stress depending on a difference of the linear expansion coefficients of the silicon and the mold resin 12 occurs in the combined sensor 1. To reduce the stress, it is necessary to decrease the linear expansion coefficient $\alpha 1$ of the mold resin 12 and decrease the linear expansion coefficient difference with the silicon. The silica particles are filled into the mold resin 12 to decrease the linear expansion coefficient $\alpha 1$ of the mold resin 12. If a silica particle filling amount increases, the linear expansion coefficient decreases. However, the epoxy resin decreases in proportion to this and adhesion of the combined sensor 1 and the chip pad 8 decreases.

If a balance of the decrease in the linear expansion coefficient and the decrease in the adhesion by silica particle filling is considered, the lower limit of the linear expansion coefficient $\alpha 1$ of the mold resin 12 is 7×10-6/° C. In this case, the silica particles are filled by about 80% (vol %).

The chip pad 8 and the lead frame are generally made of a metal material and the copper alloy (Cu) or the iron-nickel alloy (Fe-42Ni) is used according to a use or a required function. Because the member such as the chip pad 8 is also sealed with the mold resin 12, the stress caused by the linear expansion coefficient difference occurs at a contact interface of both sides and when the interface stress is high, the detachment occurs at the interface. For example, if the interface of the chip pad 8 and the mold resin 12 is detached, the mold resin 12 of the detachment portion deforms without being restricted by the chip pad 8. For this reason, an entire deformation amount of the package 7 changes from a state before the detachment and higher stress occurs in the combined sensor 1.

The linear expansion coefficient of Cu is 17×10-6/° C. and the linear expansion coefficient of Fe-42Ni is 5×10-6/° C. If the linear expansion coefficient difference with both the materials s considered, the linear expansion coefficient $\alpha 1$ of the mold resin 12 is ix 10-6/° C. and al becomes the upper limit when the combined sensor 1 is sealed with the mold resin 12.

In addition, in the mold resin 12, a material having the glass transition temperature higher than the temperature of the upper limit of the temperature environment range in which the sensor device is exposed is used. The linear expansion coefficient of the mold resin 12 increases in a high temperature range in which a temperature is equal to or higher than the glass transition temperature and deformation by expansion of the mold resin 12 occurs in the package 7. The combined sensor 1 is also deformed by the deformation and the stress occurs and affects a sensor characteristic. The glass transition temperature of the mold resin 12 is increased, so that detection stability of the combined sensor 1 in a high temperature range (for example, about 125° C.) can be improved.

The combined sensor 1 may be mounted in an engine room of a vehicle and heat resistance to endure the high temperature environment (for example, about 125° C.) is required in the combined sensor 1. In the thermosetting epoxy resin generally used as the mold resin of the transfer mold, the glass transition temperature to be a change point of a physical property exists. At the glass transition temperature as a turning point, the linear expansion coefficient of the mold resin greatly changes and the linear expansion coefficient $\alpha 2$ at the temperature equal to or higher than the glass transition temperature is higher than the linear expansion coefficient $\alpha 1$ at the temperature equal to or lower than the transition temperature. If the sensor device packaged with the mold resin is exposed in an environment in which the temperature is equal to or higher than the glass transition temperature of the mold resin, the mold resin expands according to the linear expansion coefficient $\alpha 2$. The combined sensor 1 contacting the mold resin is also deformed by the expansion of the mold resin and high stress by the deformation occurs.

To suppress the stress occurring in the combined sensor 1 under the high temperature environment, the mold resin in which the glass transition temperature is higher than the temperature (high temperature side) of the upper limit of the thermal load applied to the package 7 is used. As a result, a transfer mold type sensor device in which a characteristic is stabilized in a thermal load range (for example, −40° C. to 125° C.) in which the sensor device is exposed can be provided. When the stress occurring in the combined sensor in the low temperature range is considered, the linear expansion coefficient α1 of the mold resin is preferably close to a liner expansion coefficient of the silicon. The formation of the package in the transfer mold is generally performed at a temperature of 180° C. Because a temperature difference with 180° C. and the stress proportional to the linear expansion coefficient α1 of the mold resin 12 occur in the combined sensor, the linear expansion coefficient α1 of the mold resin 12 is selected in a range of 7 to 11×10-6/° C. according to the package structure.

Figure 17:
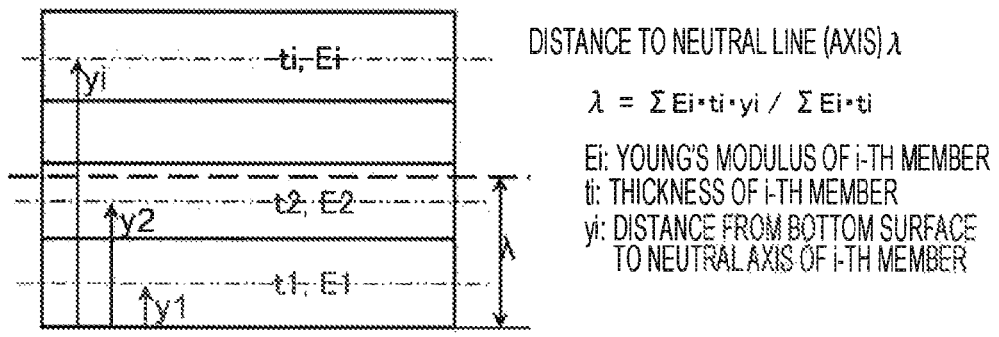
FIG. 17 is a diagram illustrating a method of calculating a neutral axis in a lamination structure.

Here, for a sensor device in which a combined sensor, a substrate (including an Si substrate and an interposer), and a chip pad are mounted in an SOP (Small Outline Package) type package, the present inventors have calculated a position of a neutral surface of the package and have examined a relation of the position of the neutral surface and a thickness of a mold resin on the sensor or a volume of the mold resin. The neutral surface of the package is calculated using a theoretical formula of laminated members illustrated in FIG. 17.

Figure 18:
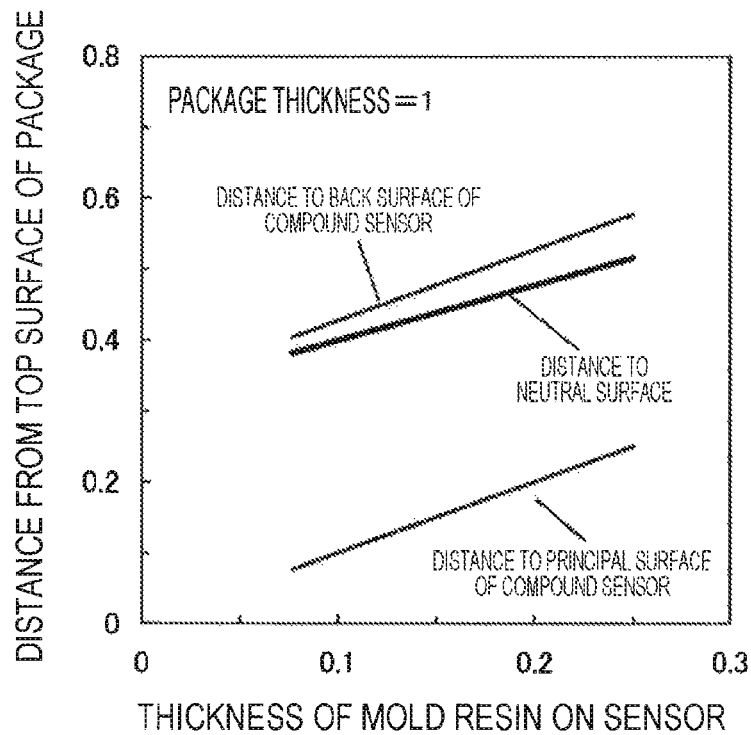
FIG. 18 is a diagram illustrating a relation of a distance from a top surface to a neutral surface of a package and a position of a combined sensor.

When the package thickness is set to 1, for the package mounted with the combined sensor (thickness ratio of 0.32), the substrate (thickness ratio of 0.23), and the chip pad (thickness ratio of 0.058), the thickness of the mold resin on the combined sensor is changed, the neutral surface is calculated, and a calculation result of a relation of a distance from a top surface of the package to the neutral surface and a position of the combined sensor is illustrated in FIG. 18. In an example of FIG. 18, the thickness of each member is set to the thickness described above, so that the combined sensor can be arranged on the neutral surface.

Figure 19:
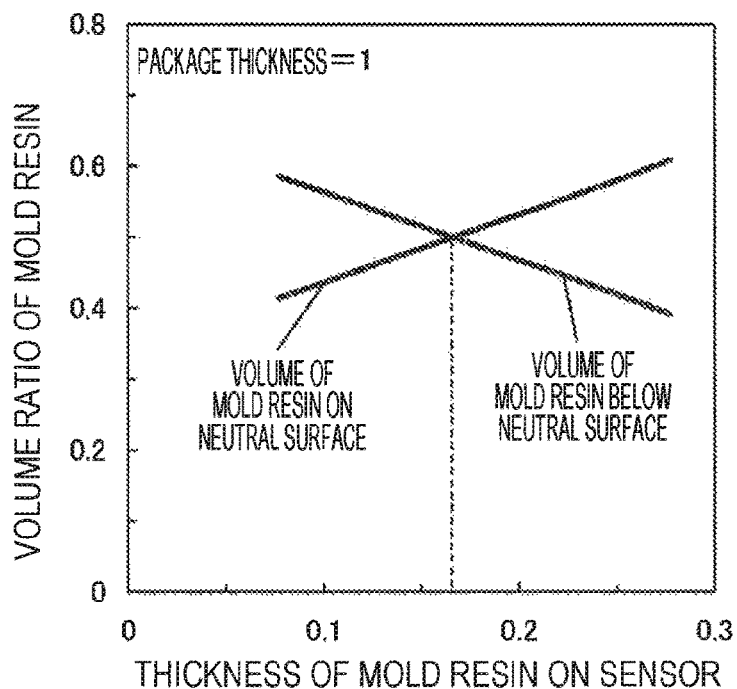
FIG. 19 is a diagram illustrating a relation of a thickness of a mold resin on a combined sensor and volumes of mold resins on and below a neutral surface.

A volume ratio of the mold resin on and below the neutral surface is calculated, a relation of the resin volume ratio and the thickness of the resin on the sensor is illustrated as illustrated in FIG. 19, and the thickness of the resin on the sensor in which the volumes of the resin on and below the neutral surface are equalized is calculated. As a result, the volumes of the resin on and below the neutral surface are equalized at the thickness 0.165 of the resin on the sensor in the member configuration. Because the volumes of the resin on and below the neutral surface are the same, the warpage deformation of the entire package is suppressed. Because the combined sensor thicker than the other members and having higher rigidity than the other members can be arranged on the neutral surface, the stress occurring in the combined sensor can be reduced.

If suppression of the stress occurring in the combined sensor is considered, the members may be arranged in the package thickness direction, such that the thickness ratio of the resin on the sensor becomes 0.165 (the case in which the package thickness is 1). However, in an actual package, the following factors need to be considered. The wire may be connected to the principal, surface of the sensor to exchange a signal between the sensor and an external device. In this case, it is necessary to secure the resin thickness to prevent the connected wire from being exposed from the package surface. If there is a difference in the thickness of the resin on and below the package mounting member, at the time of forming the package using the mold, the fluid behaviors of the mold resin on and below the package mounting member are different and a void (cavity) or a resin non-filling portion is generated in the package. Therefore, it is necessary to arrange the members in the package in consideration of wire bonding or fluidity of the mold resin while a balance of the volumes of the resin on and below the neutral surface is secured.

Figure 20:
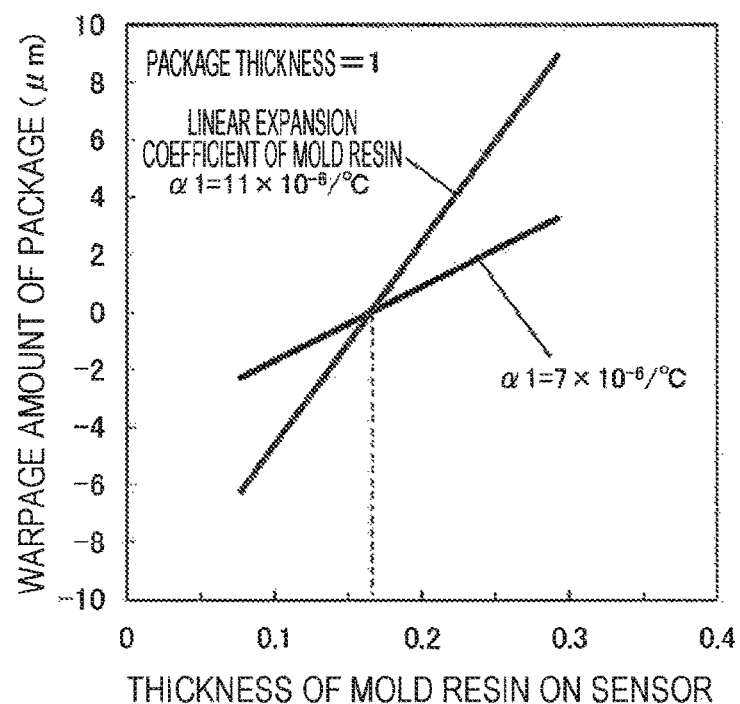
FIG. 20 is a diagram illustrating an examination result of a relation of a thickness of a mold resin on a combined sensor and a warpage amount of a package, for each linear expansion coefficient of the mold resin.

FIG. 20 illustrates each warpage change when package warpage at a thickness ratio 0.165 (a package thickness is 1) of a mold resin on the sensor is set to 0 and the linear expansion coefficient α1 of the mold resin is set to 7×10-6/° C. and 11×10-6/° C. If the thickness is increased/decreased from the thickness of the mold resin on the sensor at which the volumes of the mold resin on and below the neutral surface are equalized, as illustrated in FIG. 20, a warpage deformation amount of the package changes. The combined sensor is deformed by the warpage of the package and the high stress occurs. However, in the present invention, because the rigidity of the combined sensor increases, the stress occurring in the combined sensor can be suppressed even in a slight deviation from a position where the package warpage amount becomes 0. The deviation amount is preferably in a range in which the neutral surface is on the combined sensor. Therefore, when the combined sensor, the substrate, and the chip pad having the different thickness are laminated and mounted in the package, the combined sensor is provided to be thicker than the other members and the combined sensor is arranged on the neutral surface of the package. In addition it is preferable to determine the arrangement of the package thickness direction in consideration of the wire bonding or the resin fluidity, such that a difference of the volumes of the mold resin on and below the neutral surface decreases.

In this embodiment, the combined sensor 1 is arranged on the package neutral surface 13 in the mounting cross-section of the combined sensor 1 and the combined sensor 1, the semiconductor chip 4, and the chip pad 8 are arranged such that the volumes of the mold resin 12 on and below the package neutral surface are almost equalized. However, the volumes of the mold resin 12 on and below the neutral surface 13 may not be equalized, from a relation of the member thickness of the combined sensor 1 and the semiconductor chip 4 and the thickness of the package. One of factors is to secure the thickness t1 of the mold resin on the combined sensor 1 to some degree to prevent the wire 6 connected to the principal surface 1*a* of the combined sensor 1 from being exposed from the mold resin 12. In addition, if a difference is generated in the thickness t1 of the mold resin on the combined sensor 1 and the thickness t2 of the resin below the chip pad 8, a difference may be generated in the resin fluidities of the mold resin portions (t1 and t2) in the mold at the time of forming the package and the void or the sealing resin non-filling portion may be generated in the package. To prevent the void or the sealing resin non-filling portion from being generated, it may be necessary to change the balance of the volumes of the mold resin 12 on and below the neutral surface 13. In this case, with reference to the relation of the thickness of the mold resin on the combined sensor and the package warpage amount, illustrated in FIG. 20, the package warpage is minimized and a balance of the mold resin 12 in the package is determined in consideration of the exposure or the resin fluidity of the wire 8.

Figure 4:
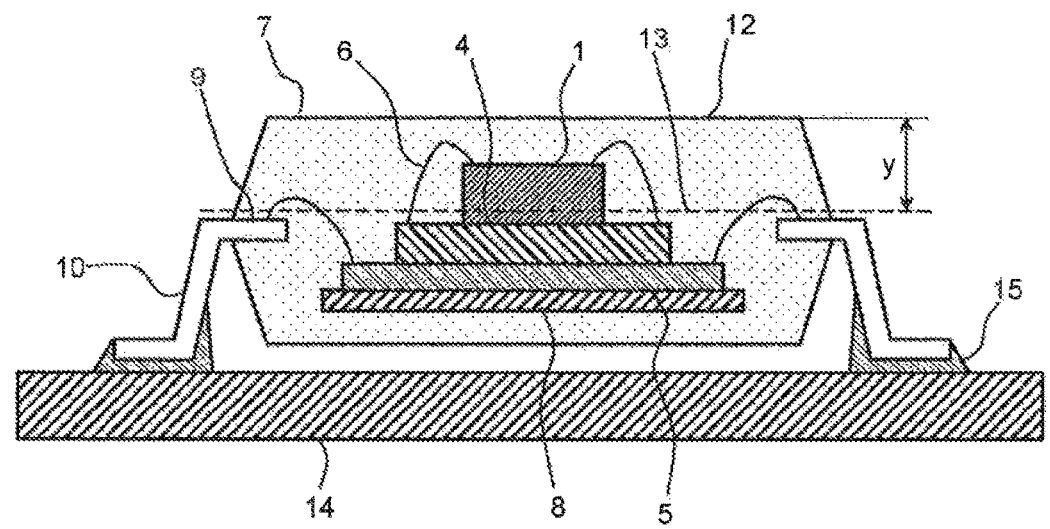
FIG. 4 is a cross-sectional view illustrating a state in which the transfer mold type sensor device illustrated in FIGS. 1 and 2 is mounted on an external mounting substrate.

FIG. 4 is a cross-sectional view illustrating an example of the case in which the transfer mold type sensor device illustrated in FIG. 1 is mounted on an external mounting substrate. In FIG. 4, a tip of the outer lead 10 aligns with a corresponding electrode portion of a mounting substrate 14 not illustrated in the drawings, is mounted on the mounting substrate, and is joined to the mounting substrate by a solder 15. As illustrated in FIG. 4, even in a state in which the sensor device is mounted on the external mounting substrate 14, if the package deformation suppression mechanism described above is provided, the deformation and the stress occurring in the combined sensor can be suppressed and an sensor output can be stabilized.

Figure 5:
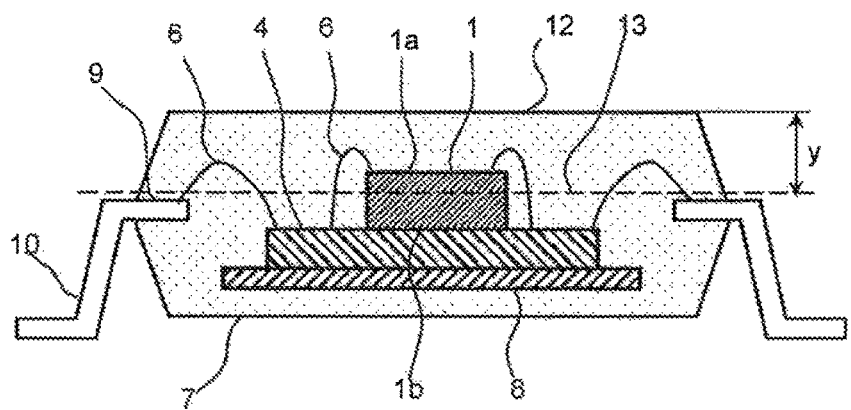
FIG. 5 is a cross-sectional view illustrating a second embodiment of a transfer mold type sensor device according to the present invention.
Figure 6:
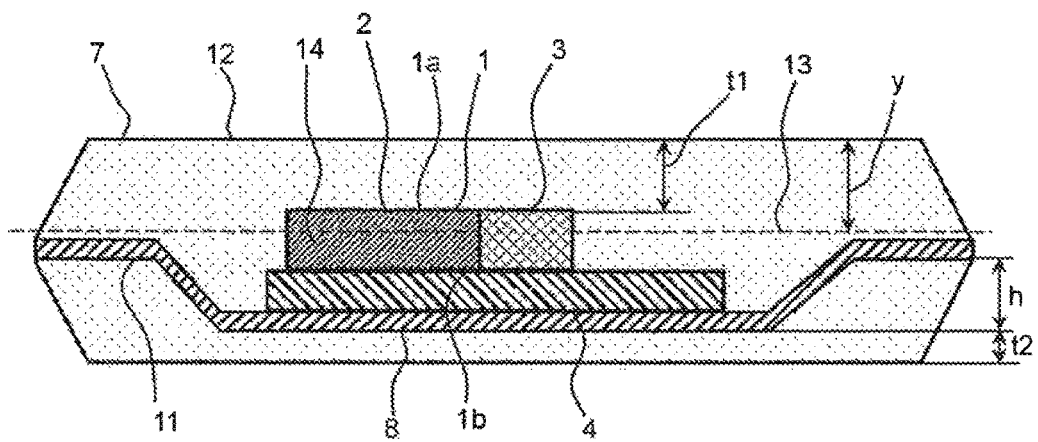
FIG. 6 is a cross-sectional view of a different direction of the transfer mold type sensor device illustrated in FIG. 5.
Figure 7:
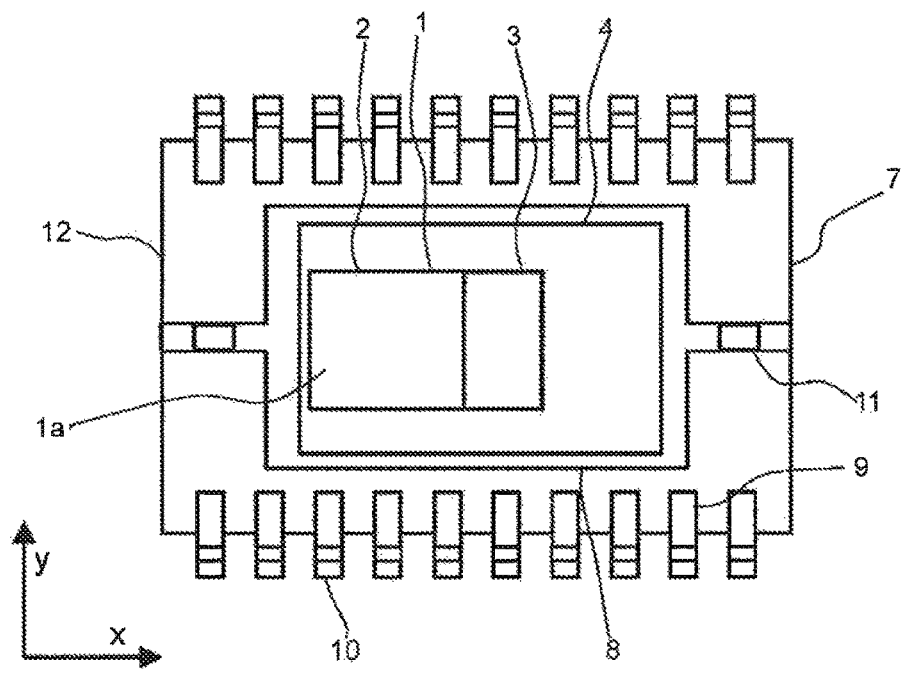
FIG. 7 is a plan view of the case in which an upper mold resin is removed from an inner lead of the transfer mold type sensor device illustrated in FIGS. 5 and 6.

Next, a second embodiment to be an example of other embodiment of the transfer mold type sensor device will be described using FIGS. 5 to 7.

A difference with the previous embodiment is that a combined sensor 1 and a semiconductor chip 4 are laminated on a chip pad 8 without using an interposer 5. Electric connection between members is performed by the same wire 6 as the embodiment illustrated in FIG. 1 and the combined sensor 1 and the semiconductor chip 4 and the semiconductor chip 4 and an inner lead 9 are electrically connected by the wire 6 illustrated in the drawings, respectively.

Even in this embodiment, the combined sensor 1 is thicker than the semiconductor chip 4 and the chip pad 8 and has higher rigidity than the semiconductor chip 4 and the chip pad 8. The combined sensor 1 is arranged on a neutral surface 13 of a package and a supported lead 11 is bent such that volumes of a mold resin 12 on and below the neutral surface 13 are almost equalized. By this configuration, a package 7 can be suppressed from being deformed by a temperature change and stress occurring in the combined sensor 1 can be reduced. Even in this embodiment, an acceleration sensor unit 3 of the combined sensor 1 is arranged in a region where a change rate is small when the package 7 is deformed by warpage, like FIGS. 2 and 3. As a result, even though the warpage occurs in the package 7, the acceleration sensor unit 3 can maintain a horizontal state and prevent a detection error from occurring.

In addition, in the transfer mold type sensor device according to this embodiment, electric connection is performed by the wire 6 in the package 7 without using the interposer 5. Even when there is no consistency in a positional relation of an electrode connecting the wire 6 of the combined sensor 1 and an electrode of the semiconductor chip 4, both sides can be electrically connected using the interposer 5. However, because the number of wires increases, a manufacturing cost may increase. For this reason, packaging of the combined sensor 1 or the semiconductor chip 4 not using the interposer 5 is effective, in terms of a cost. In addition, because the interposer 5 is not provided, the thickness of the package 7 can be decreased.

Next, an aspect of a third embodiment to be an example of other embodiment of the transfer mold type sensor device will be described using FIGS. 8 and 9.

A difference with the previous embodiments is that an angular velocity sensor unit 2 and an acceleration sensor unit 3 of a combined sensor 1 are not integrated with each other and are mounted on a semiconductor chip 4 in a separated state. Electric connection between members is performed by the same wire 6 as the embodiment illustrated in FIG. 1 and the angular velocity sensor unit 2, the acceleration sensor unit 3, and the semiconductor chip 4 and the semiconductor chip 4 and an inner lead 9 are electrically connected by the wire 6 illustrated in the drawings, respectively. The acceleration sensor unit 3 includes an X-direction acceleration sensor $3x$ having sensitivity in an X direction to be a longitudinal direction of the package 7 and a Y-direction acceleration sensor $3y$ having sensitivity in a Y direction to be a transverse direction of the package 7, with respect to the XY coordinates illustrated in FIG. 9. In this embodiment, the X-direction acceleration sensor $3x$ and the Y-direction acceleration sensor $3y$ are arranged in the Y direction.

Even in this embodiment, the angular velocity sensor unit 2 and the acceleration sensor unit 3 configuring the combined sensor 1 are thicker than the semiconductor chip 4 and the chip pad 8 and have higher rigidity than the semiconductor chip 4 and the chip pad 8. The angular velocity sensor unit 2 and the acceleration sensor unit 3 are arranged on a neutral surface 13 of a package and a supported lead 11 is bent such that volumes of a mold resin 12 on and below the neutral surface 13 are almost equalized. By this configuration, the package 7 can be suppressed from being deformed by a temperature change and stress occurring in the combined sensor 1 can be reduced. Even in this embodiment, the acceleration sensor unit 3 of the combined sensor 1 is arranged in a region where a change rate is small when the package 7 is deformed by warpage, which is a center portion of the package 7. In this embodiment, because the acceleration sensor unit 3 and the angular velocity sensor unit 2 are separated from each other, a degree of freedom of the acceleration sensor unit 3 in mounting can be increased. As a result, the acceleration sensor unit 3 can be mounted in a region where a warpage change rate is smallest, in the package 7.

Another aspect of the transfer mold type sensor device illustrated in the third embodiment will be described using FIGS. 10 and 11.

Figure 8:
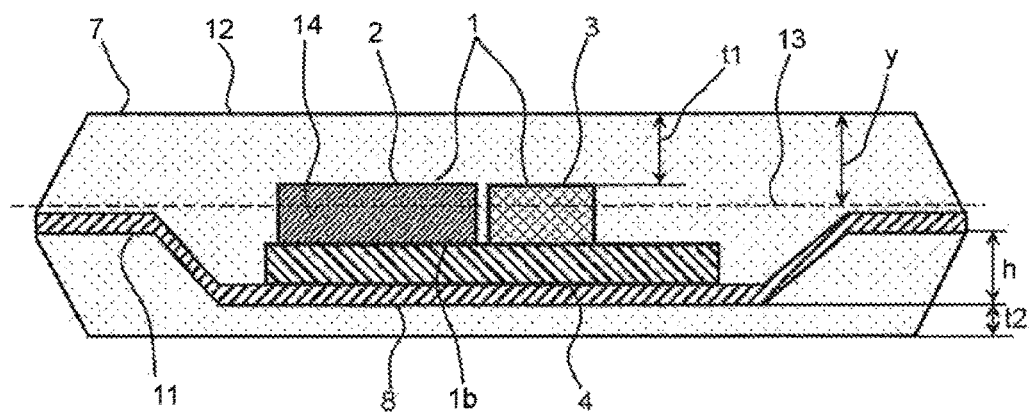
FIG. 8 is a cross-sectional view illustrating a third embodiment of a transfer mold type sensor device according to the present invention.
Figure 9:
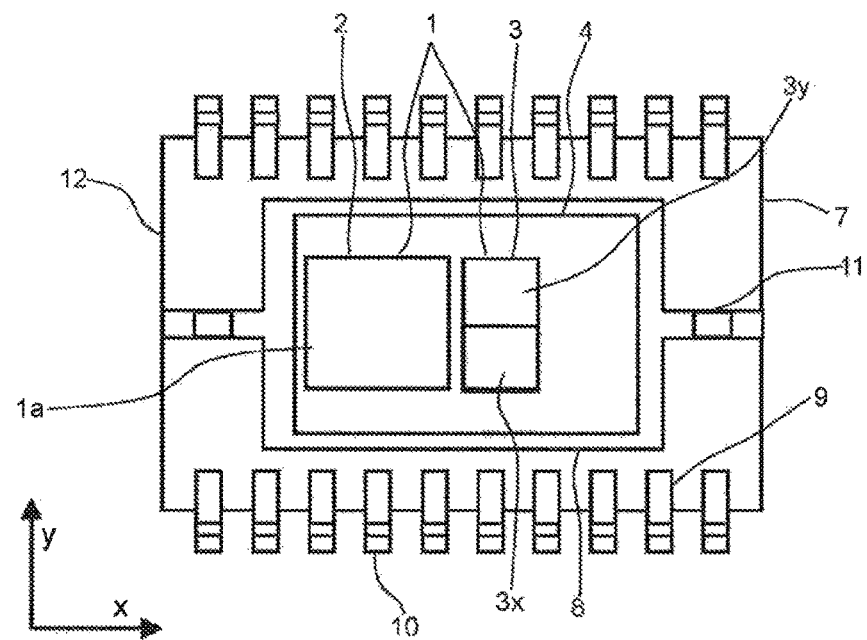
FIG. 9 is a plan view of the case in which an upper mold resin is removed from an inner lead of the transfer mold type sensor device illustrated in FIG. 8.
Figure 10:
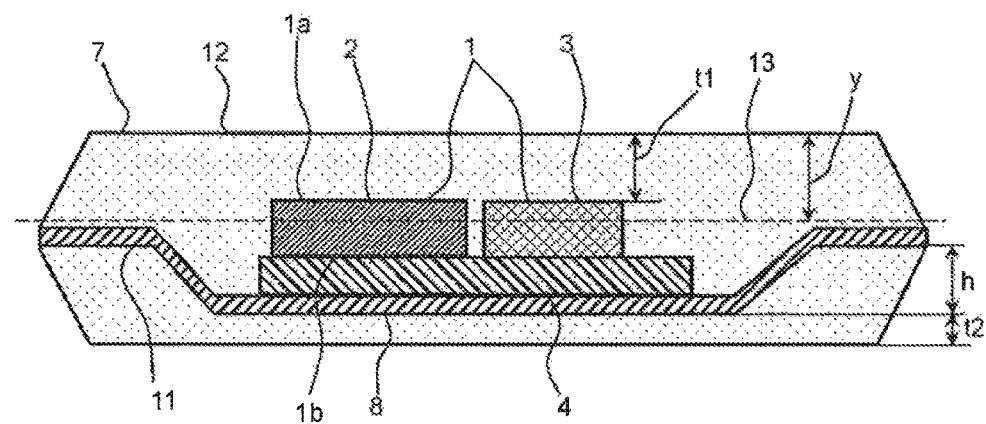
FIG. 10 is a cross-sectional view illustrating another aspect of the transfer mold type sensor device illustrated in FIG. 8.

A difference with the third embodiment illustrated in FIGS. 8 and 9 is that, different from the third embodiment in which the X-direction acceleration sensor $3x$ and the Y-direction acceleration sensor $3y$ of the acceleration sensor unit 3 are arranged in the Y direction (transverse direction of the package 7) illustrated in FIG. 10, the X-direction acceleration sensor $3x$ and the Y-direction acceleration sensor $3y$ are arranged in the X direction (longitudinal direction of the package 7) and the X-direction acceleration sensor $3x$ is mounted at the side of the angular velocity sensor unit 2 and the vicinity of a center line 16 of the longitudinal direction (X direction) of the package 7. In addition, the Y-direction acceleration sensor $3y$ is mounted on a center line 17 of the transverse direction (Y direction) of the package 7.

By this configuration, the same effect as the third embodiment can be obtained and stabilization of a sensor output having considered deformation of the package 7 occurring when the mold resin 12 absorbs moisture and expands can be realized.

It is known that the mold resin 12 is expanded (the phenomenon called swelling in general) by moisture absorption. In this case, different from when the temperature change is applied to the package 7, only the mold resin 12 expands and the deformation occurs in the package 7. As described in the previous embodiments, the combined sensor 1 is arranged on a neutral surface of the package 7, volumes of a mold resin on and below the neutral surface are almost equalized, warpage deformation (out-of-plane deformation) of the package 7 is suppressed, and stress occurring in the combined sensor 1 is reduced. When the package 7 absorbs the moisture, the warpage deformation of the package 7 is suppressed. However, because the mold resin 12 is deformed (swollen) in a plane by the swelling, the combined sensor 1 is also deformed according to the deformation. A deformation amount of the mold resin 12 in this case is correlated with a distance from the center of the package 7 and the deformation amount increases as the distance from the center of the package 7 increases. For this reason, the acceleration sensor unit 3 is preferably arranged on the center line or in the vicinity of the center line in both the X direction and the Y direction.

Figure 11:
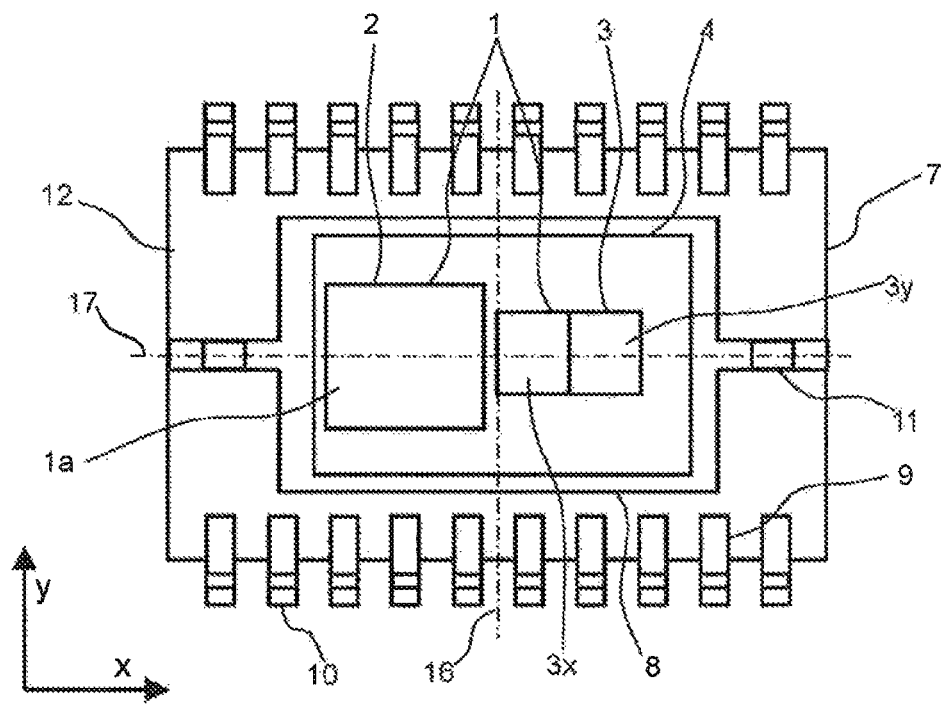
FIG. 11 is a plan view of the case in which an upper mold resin is removed from an inner lead of the transfer mold type sensor device illustrated in FIG. 10.

By the arrangement of the acceleration sensor unit 3 illustrated in FIG. 11, the X-direction acceleration sensor 3x and the Y-direction acceleration sensor 3y are arranged on the center portions of the package 7 of the X direction and the Y direction, respectively, and the change in the sensor output can be suppressed even when the mold resin 12 is deformed by absorbing the moisture.

Next, an aspect of a fourth embodiment to be an example of other embodiment of the transfer mold type sensor device will be described using the drawings.

Figure 12:
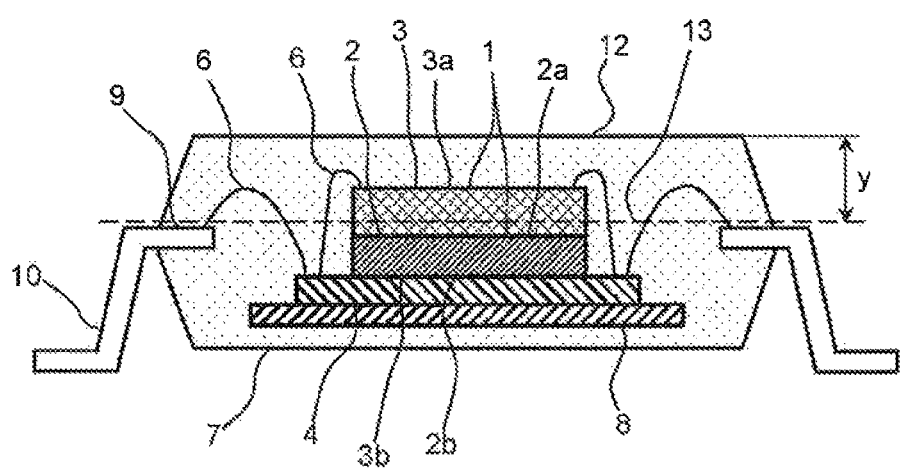
FIG. 12 is a cross-sectional view illustrating a fourth embodiment of a transfer mold type sensor device according to the present invention.

A difference with the previous embodiments is that an angular velocity sensor unit 2 and an acceleration sensor unit 3 of a combined sensor 1 are separated from each other and the angular velocity sensor unit 2 and the acceleration sensor unit 3 are sequentially mounted on a semiconductor chip 4 in a lamination state. In the embodiment of FIG. 12, the angular velocity sensor unit 2 is joined to the semiconductor chip 4 by a joint material not illustrated in the drawings and the acceleration sensor unit 3 is joined to a principal surface 2a of the angular velocity sensor unit 2 by the joint material not illustrated in the drawings. Electric connection between members and electric connection with an inner lead 9 are performed by a wire 6, similar to the embodiment illustrated in FIG. 1, and the angular velocity sensor unit 2, the acceleration sensor unit 3, and the semiconductor chip 4 and the semiconductor chip 4 and the inner lead 9 are electrically connected by the wire 6 not illustrated in the drawings, respectively. Both parts of a principal surface 3a of the acceleration sensor unit 3 and the principal surface 2a of the angular velocity sensor unit 2 are covered with a mold resin 12. In addition, a back surface 3b of the acceleration sensor unit 3 and a back surface 2b of the angular velocity sensor unit 2 contact the principal surface 2a of the angular velocity sensor unit 2 and a top surface of the semiconductor chip 4 by the joint material not illustrated in the drawings, respectively. A position of a thickness direction of the acceleration sensor unit 3 in the package 7, the thickness of the angular velocity sensor unit 2 and the semiconductor chip 4, and a Young's modulus of the chip pad 8 are adjusted, such that the acceleration sensor unit 3 configuring the combined sensor 1 can be arranged on a neutral surface 13 of a package thickness direction.

Figure 13:
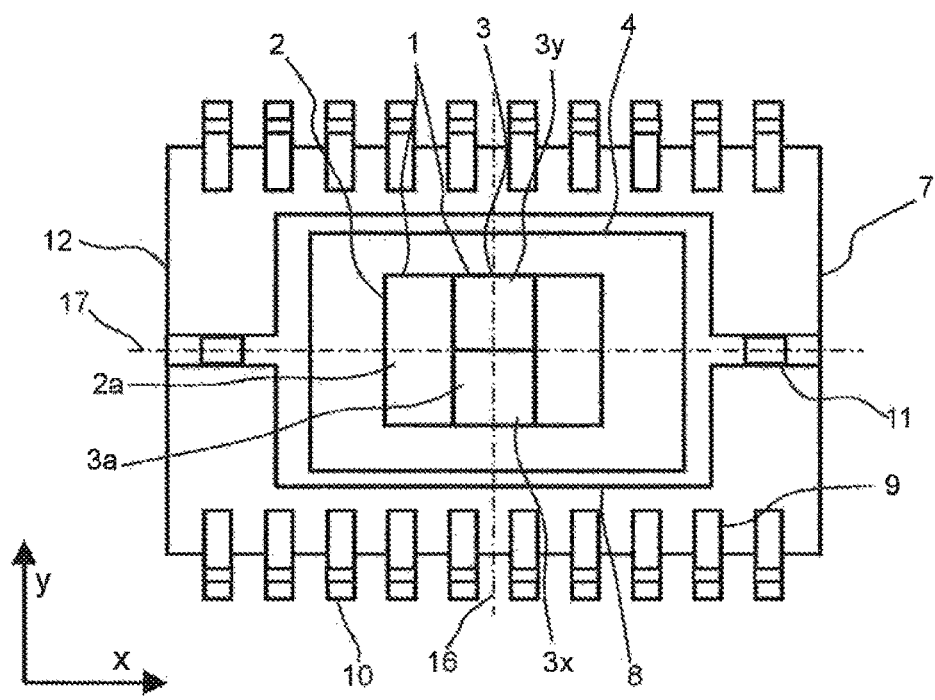
FIG. 13 is a plan view of the case in which an upper mold resin is removed from an inner lead of the transfer mold type sensor device illustrated in FIG. 12.

The acceleration sensor unit 3 includes an X-direction acceleration sensor 3x having sensitivity in an X direction and a Y-direction acceleration sensor 3y having sensitivity in a Y direction, with respect to the XY coordinates illustrated in FIG. 13.

The X-direction acceleration sensor 3x and the Y-direction acceleration sensor 3y are arranged in the Y direction.

As illustrated in FIG. 12, both the angular velocity sensor unit 2 and the acceleration sensor unit 3 can be arranged in a center portion of the package 7 by separating the angular velocity sensor unit 2 and the acceleration sensor unit 3 from each other and mounting the angular velocity sensor unit 2 and the acceleration sensor unit 3 in a lamination state. In addition, at least one sensor of the X-direction acceleration sensor 3x and the Y-direction acceleration sensor 3y can be arranged on center lines 16 and 17 of the package. In the example of FIG. 12, the X-direction acceleration sensor 3x is arranged on the X-direction center line 16.

Even in this embodiment, because the acceleration sensor unit 3 is arranged on the neutral surface 13 of the package 7 the stress occurring in the acceleration sensor unit 3 can be reduced, even though the thermal change is applied to the package 7 and the package 7 is deformed by warpage. In addition, because the acceleration sensor unit 3 is thicker than the other members and has higher rigidity than the other members, the stress can be reduced. The angular velocity sensor unit 2 and the acceleration sensor unit 3 are arranged in the center portion of the package 7, so that the center portion of the package 7 becomes a region where the change rate of the warpage deformation is smallest. As a result, even though the warpage occurs in the package 7, the acceleration sensor unit 3 can maintain a horizontal state and prevent occurrence of the detection error. Even when the mold resin 12 absorbs the moisture and is swollen, the deformation occurring in the acceleration sensor unit 3 can be reduced and the chance in the sensor output can be suppressed. By this configuration, even when the package 7 is deformed by the thermal change or the moisture absorption of the mold resin 12, a comb-shaped structure (not illustrated in the drawings) in the acceleration sensor unit 3 can be suppressed from deforming, detection stability of physical amounts to be detected can be improved, and a sensor device with a small detection error can be provided.

Figure 14:
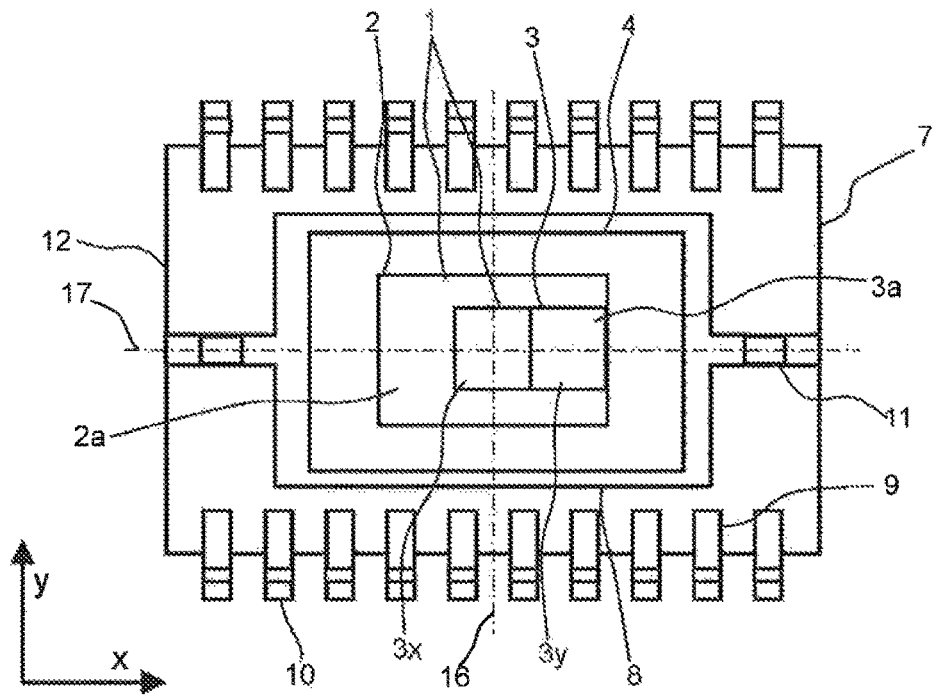
FIG. 14 is a plan view of the case in which an upper mold resin is removed from an inner lead, which illustrates another aspect of the transfer mold type sensor device illustrated in FIGS. 12 and 13.

Another aspect of the fourth embodiment according to the present invention illustrated in FIGS. 12 and 13 will be described using FIG. 14. A difference with the fourth embodiment is that the X-direction acceleration sensor 3x and the Y-direction acceleration sensor 3y are mounted to be arranged in the Y direction to be the longitudinal direction of the package 7. By this mounting, the X-direction acceleration sensor 3x can be arranged on the X-direction center line 16 and the Y-direction acceleration sensor 3y can be arranged on the Y-direction center line 17. The acceleration sensors of both the X and Y directions are arranged on the center lines, respectively, so that an output of the acceleration sensor unit 3 can be suppressed from changing due to the deformation occurring when the mold resin 12 absorbs the moisture in particular.

Figure 15:
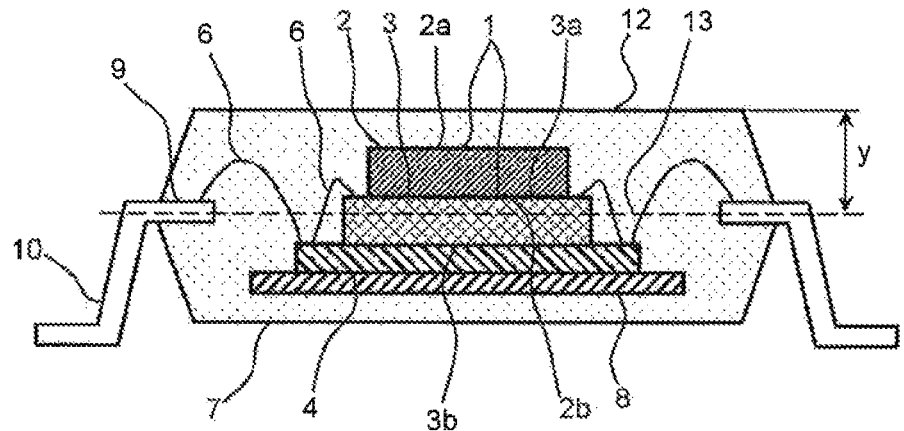
FIG. 15 is a cross-sectional view illustrating still another aspect of the transfer mold type sensor device illustrated in FIG. 12.
Figure 16:
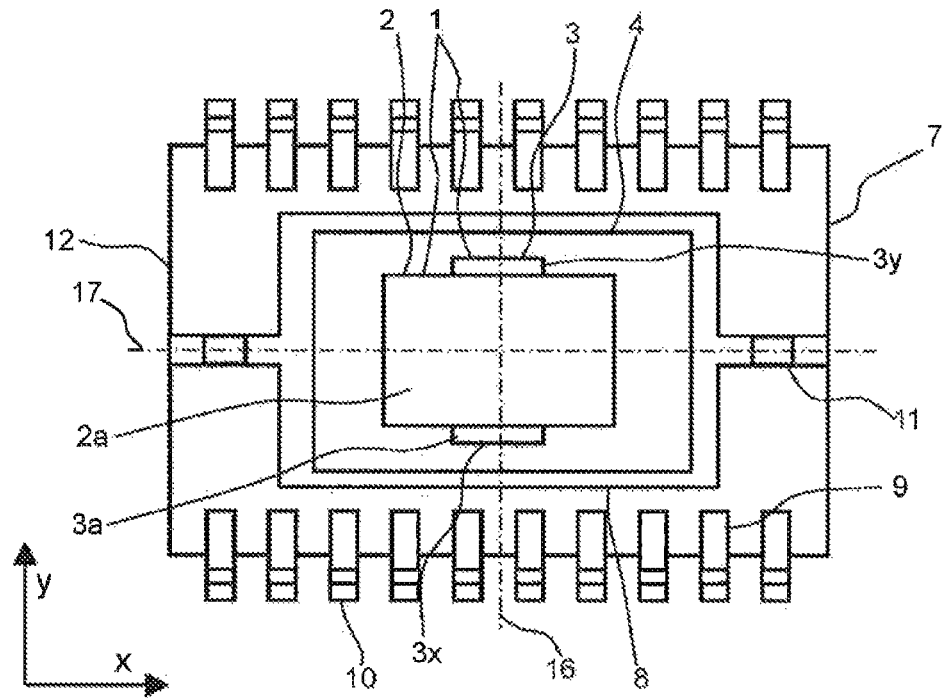
FIG. 16 is a plan view of the case in which an upper mold resin is removed from an inner lead of the transfer mold type sensor device illustrated in FIG. 15.

Still another aspect of the fourth embodiment will be described using FIGS. 15 and 16.

A difference with the fourth embodiment is that the acceleration sensor unit 3 and the angular velocity sensor unit 2 are laminated on the semiconductor chip 4, sequentially from the side of the semiconductor chip 4. The thickness direction position of each mounting member in the package 7 is adjusted such that the acceleration sensor unit 3 can be arranged on the neutral surface 13 of the package thickness direction.

In this embodiment, the portions on and below the acceleration sensor unit 3 are covered with the members having almost the same rigidity, the angular velocity sensor unit 2, and the semiconductor chip 4. By this configuration, it is not necessary to adjust the thickness of the angular velocity sensor unit 2 and the semiconductor chip 4 to arrange the acceleration sensor unit 3 on the neutral surface 13 of the package and the thickness of the angular velocity sensor unit 2 can be almost equalized to the thickness of the acceleration sensor unit 3. As a result, the rigidity of the angular velocity sensor unit 3 can be maintained, the stress occurring in the sensor can be reduced, and the output change of the angular velocity sensor unit 3 can be suppressed.

In addition, most of the principal surface 3a of the acceleration sensor unit 3 can be covered with the angular velocity sensor unit 2 and a contact area with the mold resin 12 can be decreased. By this configuration, an influence of the deformation by the thermal deformation or the swelling of the mold resin 12 decreases and the deformation of the acceleration sensor unit 3 is suppressed. By this configuration, the thickness of the mold resin 12 on the angular velocity sensor unit 2 existing in the uppermost portion (upward direction of the drawing) of the package 7 and the thickness of the mold resin 12 below the chip pad 8 of the lowermost portion can be almost equalized. As a result, the resin fluidities of the upper and lower portions of the package in the mold when the package is formed are almost equalized and the void or the mold resin non-filling portion can be prevented from being generated in the package.

In the embodiments described above, the sensor device in which the combined sensor 1 is mounted with the angular velocity sensor unit of one axis (one direction) and the acceleration sensor unit of two axes (two directions) is described as the example. The number of detection axes of each sensor unit is not limited to the range illustrated in the embodiments. For example, the acceleration sensor unit may have one axis and may have three axes or more.

REFERENCE SIGNS LIST 1 combined sensor
2 angular velocity sensor
3 acceleration sensor
4 semiconductor chip
5 interposer
6 wire
7 package
8 chip pad
9 inner lead
10 outer lead
11 supported lead
12 sealing resin
13 neutral surface
14 mounting substrate
15 solder
16 center line of package longitudinal direction
17 center line of package transverse direction

The invention claimed is:

1. A transfer mold type sensor device in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed,
wherein the combined sensor is configured to be thicker than the substrate and the chip pad,
a principal surface side of the combined sensor is covered with the mold resin and a back surface side thereof contacts the substrate by a joint material,
the combined sensor is arranged on a package neutral surface in a cross-section of a thickness direction of the package including the combined sensor, the substrate, and the chip pad, and
wherein the combined sensor, the substrate, and the chip pad are laminated in the thickness direction of the package, such that volumes of the mold resin on and below the package neutral surface are almost equalized.

2. A transfer mold type sensor device in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed,
wherein the combined sensor is configured to be thicker than the substrate and the chip pad,
a principal surface side of the combined sensor is covered with the mold resin and a back surface side thereof contacts the substrate by a joint material,
the combined sensor is arranged on a package neutral surface in a cross-section of a thickness direction of the package including the combined sensor, the substrate, and the chip pad, and
wherein the lead frame includes an inner lead portion inside the package and an outer lead portion outside the package and the chip pad mounted with the combined sensor and the substrate and a boundary portion of the inner lead portion and the outer lead portion are positioned at different heights in the thickness direction of the package.

3. A transfer mold type sensor device in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed,
wherein the combined sensor is configured to be thicker than the substrate and the chip pad,
a principal surface side of the combined sensor is covered with the mold resin and a back surface side thereof contacts the substrate by a joint material,
the combined sensor is arranged on a package neutral surface in a cross-section of a thickness direction of the package including the combined sensor, the substrate, and the chip pad, and
wherein the substrate is composed of a semiconductor chip.

4. A transfer mold type sensor device in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed,
wherein the combined sensor is configured to be thicker than the substrate and the chip pad,
a principal surface side of the combined sensor is covered with the mold resin and a back surface side thereof contacts the substrate by a joint material,
the combined sensor is arranged on a package neutral surface in a cross-section of a thickness direction of the package including the combined sensor, the substrate, and the chip pad, and
wherein the substrate is composed of a printed wiring board provided with a semiconductor chip and a wiring pattern and the semiconductor chip is laminated on the printed wiring board by the joint material.

5. A transfer mold type sensor device in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed,
wherein the combined sensor is configured to be thicker than the substrate and the chip pad, a principal surface side of the combined sensor is covered with the mold resin and a back surface side thereof contacts the substrate by a joint material, the combined sensor is arranged on a package neutral surface in a cross-section of a thickness direction of the package including the combined sensor, the substrate, and the chip pad, and wherein a sensor having high sensitivity to deformation of the package among a plurality of sensors configuring the combined sensor is arranged on the package neutral surface in the cross-section of the thickness direction of the package including at least the combined sensor, the substrate, and the chip pad.

6. A transfer mold type sensor device, in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed, wherein the combined sensor is configured to be thicker than the substrate and the chip pad, a principal surface side of the combined sensor is covered with the mold resin and a back surface side thereof contacts the substrate by a joint material, the combined sensor is arranged on a package neutral surface in a cross-section of a thickness direction of the package including the combined sensor, the substrate, and the chip pad, and wherein a sensor having high sensitivity to deformation of the package among a plurality of sensors configuring the combined sensor is arranged in a region where a change rate of package warpage deformation caused by a thermal load applied to the package is small.

7. A transfer mold type sensor device in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed, wherein the combined sensor is configured to be thicker than the substrate and the chip pad, a principal surface side of the combined sensor is covered with the mold resin and a back surface side thereof contacts the substrate by a joint material, the combined sensor is arranged on a package neutral surface in a cross-section of a thickness direction of the package including the combined sensor, the substrate, and the chip pad, and wherein a linear expansion coefficient of the mold resin is set in a range of 7 to $11\times10^{-6}/°C$.

8. The transfer mold type sensor device according to claim 7, wherein a sensor having high sensitivity to deformation of the package among a plurality of sensors configuring the combined sensor is arranged on the package neutral surface in the cross-section of the thickness direction of the package including at least the combined sensor, the substrate, and the chip pad.

9. The transfer mold type sensor device according to claim 7, wherein a sensor having high sensitivity to deformation of the package among a plurality of sensors configuring the combined sensor is arranged in a region where a change rate of package warpage deformation caused by a thermal load applied to the package is small.

10. A transfer mold type sensor device in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed, wherein the combined sensor is configured to be thicker than the substrate and the chip pad, a principal surface side of the combined sensor is covered with the mold resin and a back surface side thereof contacts the substrate by a joint material, the combined sensor is arranged on a package neutral surface in a cross-section of a thickness direction of the package including the combined sensor, the substrate, and the chip pad, and wherein a glass transition temperature of the mold resin is equal to or higher than a temperature of the upper limit of a thermal load range applied to the package.

11. A transfer mold type sensor device in which a combined sensor including a plurality of sensors having a function of detecting physical amounts, a substrate processing a signal from the combined sensor and controlling a signal input/output with an external device, a chip pad mounted with the combined sensor and the substrate, and a lead frame are sealed with a mold resin and a package is formed, wherein the combined sensor is configured to be thicker than the substrate and the chip pad, a principal surface side of the combined sensor is covered with the mold resin and a back surface side thereof contacts the substrate by a joint material, the combined sensor is arranged on a package neutral surface in a cross-section of a thickness direction of the package including the combined sensor, the substrate, and the chip pad, and wherein the combined sensor includes a plurality of acceleration sensors and an angular velocity sensor.

* * * * *